United States Patent [19]

Nakanishi et al.

[11] Patent Number: 5,276,831
[45] Date of Patent: Jan. 4, 1994

[54] MEMORY CARTRIDGE HAVING A MULTI-MEMORY CONTROLLER WITH MEMORY BANK SWITCHING CAPABILITIES AND DATA PROCESSING APPARATUS

[75] Inventors: Yoshiaki Nakanishi; Katsuya Nakagawa, both of Kyoto, Japan

[73] Assignee: Nintendo Co. Limited, Kyoto, Japan

[21] Appl. No.: 527,956

[22] Filed: May 24, 1990

Related U.S. Application Data

[62] Division of Ser. No. 119,551, Nov. 12, 1987, Pat. No. 4,949,298.

[30] Foreign Application Priority Data

Nov. 19, 1986 [JP] Japan ................ 61-277543

[51] Int. Cl.$^5$ ............................................. G06F 12/00
[52] U.S. Cl. ................................. 395/425; 395/800; 364/926.9; 364/926.92; 364/964; 364/968; 364/DIG. 2
[58] Field of Search ................ 395/425, 800; 364/200 MS File, 900 MS File

[56] References Cited

U.S. PATENT DOCUMENTS

| | | | |
|---|---|---|---|
| 3,737,860 | 6/1973 | Sporer | 364/200 |
| 4,095,791 | 6/1978 | Smith et al. | 273/85 G |
| 4,118,773 | 10/1978 | Raguin et al. | 364/200 |
| 4,120,030 | 10/1978 | Johnstone | 364/200 |
| 4,149,027 | 4/1979 | Asher et al. | 174/52.1 |
| 4,153,937 | 5/1979 | Poland | 364/706 |
| 4,218,582 | 8/1980 | Hellman et al. | 364/900 X |
| 4,352,492 | 10/1982 | Smith | 273/1 GC |
| 4,368,515 | 1/1983 | Nielsen | 395/425 |
| 4,374,417 | 2/1983 | Bradley et al. | 364/200 |
| 4,383,296 | 5/1983 | Sander | 364/200 |
| 4,384,326 | 5/1983 | Devchoudhury | 364/200 |
| 4,432,067 | 2/1984 | Nielsen | 364/900 |
| 4,442,486 | 4/1984 | Mayer | 364/200 |
| 4,446,519 | 5/1984 | Thomas | 364/300 |
| 4,454,594 | 6/1984 | Heffron et al. | 364/900 |
| 4,458,315 | 7/1984 | Uchenick | 364/200 X |
| 4,462,076 | 7/1984 | Smith, III | 364/200 |
| 4,471,163 | 9/1984 | Donald et al. | 364/200 X |
| 4,481,570 | 11/1984 | Wiker | 364/200 |
| 4,485,457 | 11/1984 | Balaska et al. | 364/900 |
| 4,492,582 | 1/1985 | Chang et al. | 434/169 |
| 4,500,879 | 2/1985 | Smith, III et al. | 340/739 |
| 4,503,491 | 3/1985 | Lushtak et al. | 364/200 |
| 4,562,306 | 12/1985 | Chou et al. | 364/200 X |
| 4,575,621 | 3/1986 | Dreifus | 235/380 |
| 4,575,622 | 3/1986 | Pellegrini | 235/382 |
| 4,613,953 | 9/1986 | Bush et al. | 364/900 |
| 4,644,495 | 2/1987 | Crane | 364/900 |
| 4,713,759 | 12/1987 | Yamagishi et al. | 364/200 |
| 4,725,945 | 2/1988 | Krondstadt et al. | 364/200 |
| 4,757,468 | 7/1988 | Domenik et al. | 364/900 |

FOREIGN PATENT DOCUMENTS

88111/82  4/1983  Australia .
90769/82  6/1983  Australia .

OTHER PUBLICATIONS

K. Li, "Universal Video Interface", IEEE, Trans. on Cons. Electr., vol. CE-25, No. 5, pp. 741-753, Nov. 1979.
K. Robinson, "Overcoming Addressing Limitations with Page-Addressed EPROM's", Electronic Engineering, vol. 58, No. 711, pp. 131-134, Mar. 1986.
J. Hardway, "146805 µP Addresses an Extra 10 k Bytes", E.D.N. Electrical Design News, vol. 30, No. 20, pp. 303-304, Sep. 1985.
K. M. Guttag, "The TMS 9918, Video Display Processor for Personal Computers", Wescon Conf. Record, vol. 24, pp. 1-4, Sep. 1980.

*Primary Examiner*—Thomas C. Lee
*Assistant Examiner*—Paul Harrity
*Attorney, Agent, or Firm*—Nixon & Vanderhye

[57] ABSTRACT

A memory cartridge having a case and a printed circuit board housed in the case connected, in use to a data processing unit including a microprocessor and a picture processing unit. A memory cooperating with the data processing unit is installed on the printed circuit board, and an area of the memory is divided into a plurality of banks. A multi-memory controller installed on the printed circuit board includes a plurality of registers into which microprocessing generated data, representing bank switching conditions, are loaded. An address for switching the memory banks is output in response to the content of at least one of a plurality of registers. Thus, by changing the above-described data, the microprocessor can specify a specific bank at a specific time and utilize that bank.

12 Claims, 9 Drawing Sheets

V-RAM

ONE SCREEN

V-SCROLL

H-SCROLL

MEMORY CARTRIDGE HAVING A MULTI-MEMORY CONTROLLER WITH MEMORY BANK SWITCHING CAPABILITIES AND DATA PROCESSING APPARATUS

This is a division of application Ser. No. 07/119,551, filed Nov. 12, 1987 now U.S. Pat. No. 4,949,298.

BACKGROUND OF THE INVENTION

1. Field of the Invention

The present invention relates to a memory cartridge. More specifically, the present invention relates to a memory cartridge which can be attached to and detached from a data processing unit, such as in a video game apparatus connected to a conventional television receiver.

2. Description of the Prior Art

The following are examples of data processing units in which an image is displayed on a television receiver: a video game machine called "Family Computer" (trade mark) or "Nintendo Entertainment System" (trade mark), which is manufactured and sold by the applicant of the present invention and a personal computer called "MSX" (trade mark). These data processing units are enabled by receiving an external memory cartridge containing an educational or game software program that has been written in advance and stored in the cartridge memory. A read-only memory (ROM) for storing program data and character data for display are contained in the memory cartridge.

For memory cartridges used in the above-described manner, recently, memory size has been increased to a larger capacity, for example, 1M bits or 4M bits. In the case where such a large-capacity memory is employed, since address space accessible from a central processing unit in the data processing unit is limited, a so-called "bank switching" technique has been employed.

U.S. Pat. No. 4,432,067 is a method for expanding memory capacity while the number of address lines, or the address space, connected to the data processing unit, is maintained at a predetermined number. U.S. Pat. No. 4,432,067 discloses a memory cartridge having an address decoder, a latch circuit, a supplemental memory chip and a signal line for a memory chip.

In U.S. Pat. No. 4,432,067 the address decoder detects when the address data is a specific address that requires change-over (i.e., selection) of another memory chip. Then the memory chip is switched by the latch circuit and the signal line. This means that the change-over or switching of the memory chip is controlled by a dedicated hardware circuit and is performed only on a memory chip to memory chip basis. Therefore, it is impossible to switch a bank of an arbitrary memory size. Furthermore, since only that switching determined by the hardware circuit can be executed, there are many restrictions in designing a computer game or other program.

SUMMARY OF THE INVENTION

Therefore, the principal object of the present invention is to provide a memory cartridge allowing bank switching of a memory of an arbitrary memory size.

Another object of the present invention is to provide a memory cartridge capable of switching banks based on a program of a data processing unit. The degree of freedom of program design will thus be increased.

Still another object of the present invention is to provide a memory cartridge capable of increasing the functions of an external memory.

To be brief, a memory cartridge in accordance with the present invention is attachable to and detachable from a data processing unit that includes a microprocessor. The memory cartridge is loaded in the data processing unit when used and comprises a printed circuit board connected to the data processing unit when loaded therein, a memory installed on the printed circuit board and having its memory area divided into a plurality of banks, and memory controlling means which is also installed on the printed circuit board. The memory controlling means receives data representing bank switching conditions sent from the microprocessor and provides an address that specifies a bank to the memory. The memory controlling means includes a plurality of registers to which the data from said microprocessor is provided, and address generating means for generating said address based on the data of the registers.

When the memory cartridge is loaded in the data processing unit, the printed circuit board is connected to the data processing unit, and the system comprising the memory cartridge and the data processing unit is enabled. The data representing bank switching conditions is sent from the microprocessor of the data processing unit to the memory cartridge. Based on this data, the memory controlling means sends to the memory an address corresponding to the bank to be selected. Accordingly, the selected bank of the memory is directly accessed from the microprocessor of the data processing unit.

In accordance with the present invention, the memory controlling means provides the address for bank switching of the memory based on the data from the microprocessor of the data processing unit. Therefore, any bank of the memory can be selectively enabled by changing the data from the microprocessor. By having the microprocessor change the data based on the progress of the program step, the bank switching of the memory can be executed according to the program. For that reason, the memory cartridge in accordance with the present invention can improve the degree of freedom in designing or using the program when compared with the conventional memory cartridge in which the bank change-over is effected by a hardware circuit.

These objects and other objects, features, aspects and advantages of the present invention will become more apparent from the following detailed description of the embodiments of the present invention when taken in conjunction with the accompanying drawings.

DETAILED DESCRIPTION OF THE DRAWINGS

Figure 1:
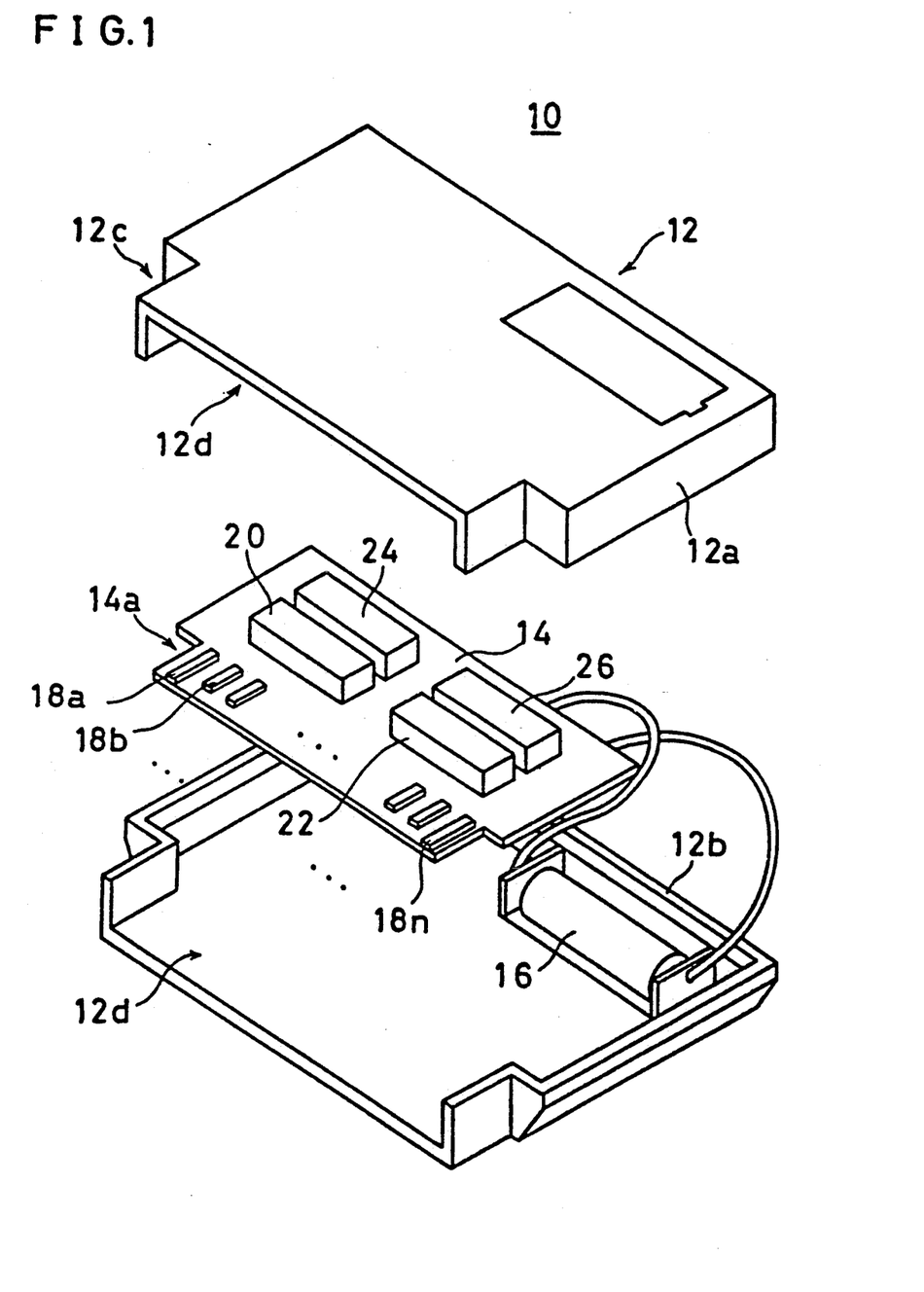
FIG. 1 is an exploded perspective view showing one embodiment of a memory cartridge in accordance with the present invention.

In reference to FIG. 1, a memory cartridge 10 of this embodiment includes a case 12 formed by an upper case 12a and a lower case 12b. The case 12 is formed nearly in a rectangle, and a protrusion 12c is formed at one side thereof. An opening 12d is formed by the protrusion 12c and the other sides of the case 12 are blocked by side walls.

A printed circuit board 14 and a power supply 16 are housed in the case 12. A protrusion 14a is formed at the portion of the printed circuit board 14 corresponding to the protrusion 12c of the above-described case 12. The protrusion 14a of the printed circuit board 14 is exposed through the opening 12d of the case 12. Then, on the protrusion 14a, conductive patterns, or connecting electrodes 18a–18n, constituting connecting means to an edge connector 32 (FIG. 2) of a game machine main unit 30 are formed so as to be distributed in the direction that the side of the protrusion 14a extends.

A program memory 20 composed of a non-volatile semiconductor memory, for example ROM or EEPROM, is mounted on the main surface of the printed circuit board 14. The program memory 20 has a memory area of, for example, 4M bits, wherein program data required for the execution of a predetermined operation of a central processing unit (CPU) 34 (FIG. 2) included in the game machine main unit 30 is stored in advance. Also, a character memory 22 consisting of a similar non-volatile semiconductor memory is installed on the printed circuit board 14. The character memory 22 has a memory area of, for example, 4M bits, wherein data (character data) relating to game characters or the like is stored in advance. An expansion memory 24 is installed on the printed circuit board 14, and the expansion memory 24 can be utilized where the capacity of the program memory 20 is inadequate. The expansion memory 24 may be a RAM having a capacity of, for example, 64K bits.

A multi-memory controller (MMC) 26 constituting one of the features of this embodiment is installed on the printed circuit board 14. The MMC 26 receives data from the CPU 34 and a PPU 42 of the game machine main unit 30. The MMC 26 is being used to switch banks of the program memory 20 and/or the character memory 22.

The aforementioned power supply 16 installed in the case 12 is utilized for back-up of the above-described expansion memory 24. For the power supply 16, the primary battery can be a lithium battery or alkaline battery and the secondary battery, which can be charged, can be a nickel-cadmium battery or an electrostatic capacitor such as an electric double-layer capacitor.

In addition, the above-described character memory 22 may be a RAM as does the expansion memory 24. A power supply for back-up will then have to be provided as in the expansion memory 24.

The present invention is applicable to a memory cartridge in which a casing and a printed circuit board are united to form a compact, thin card-like memory, such as an IC card.

Figure 2:
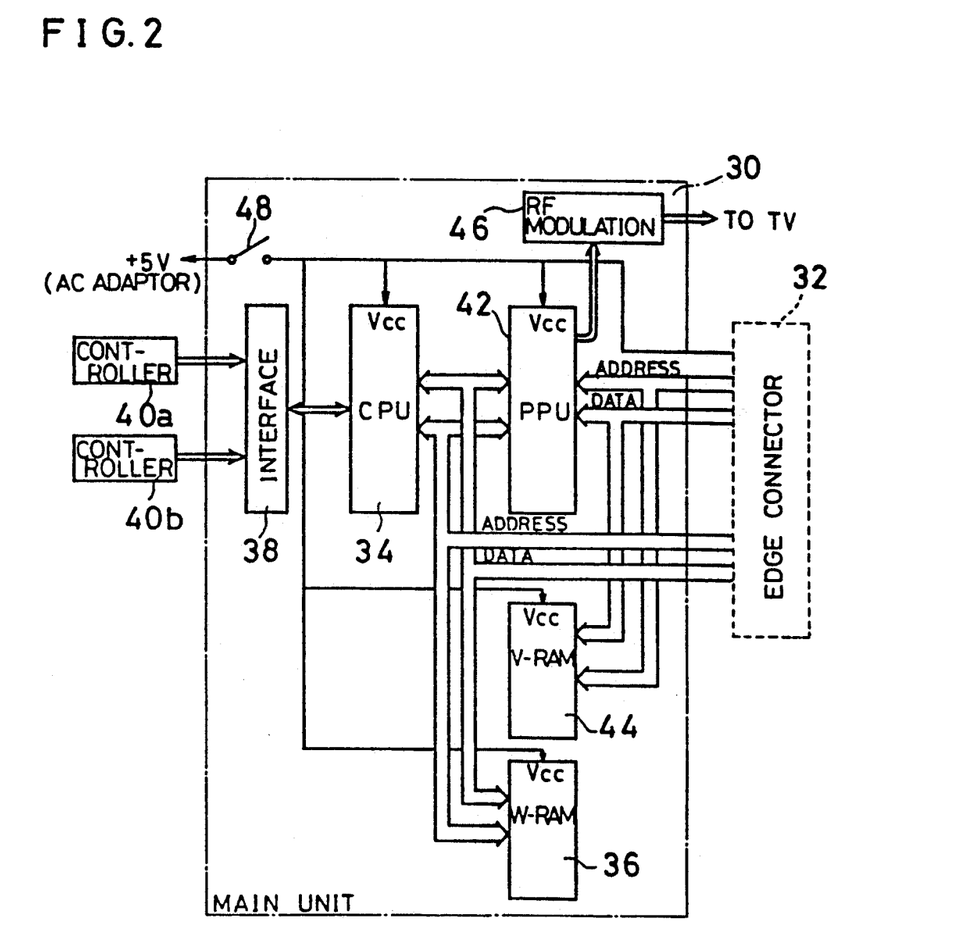
FIG. 2 is a block diagram showing one example of a data processing unit to which FIG. 1 embodiment is applicable.

The game machine main unit 30, one example of the data processing unit for which the cartridge of the embodiment can be utilized, is shown in FIG. 2. The electrodes 18a–18n of the cartridge 10 are inserted into an edge connector 32 of the main unit 30, to thereby electrically connect the cartridge 10 and main unit 30, thus forming one system.

The game machine main unit 30 includes the eight-bit microprocessor (CPU) 34, for example, the integrated circuit "2A03" manufactured by Nintendo. Game controllers 40a and d to the CPU 34 through an I/O interface 38.

Furthermore, a working RAM (W-RAM) 36, a PPU 42 (picture processing unit), a video RAM (V-RAM) 44, and an RF modulator 46 are installed in the main unit 30. For the PPU 42, for example, the integrated circuit "2C02" manufactured by Nintendo is used. The PPU 42 reads data of the character memory 22 and the V-RAM 44 under the control of the CPU 34, converts the same into video signals and sends these signals to the RF modulator 46. The RF modulator 46 modulates the video signal, outputting a television signal of, for example, NTSC standard to the television receiver.

Figure 3:
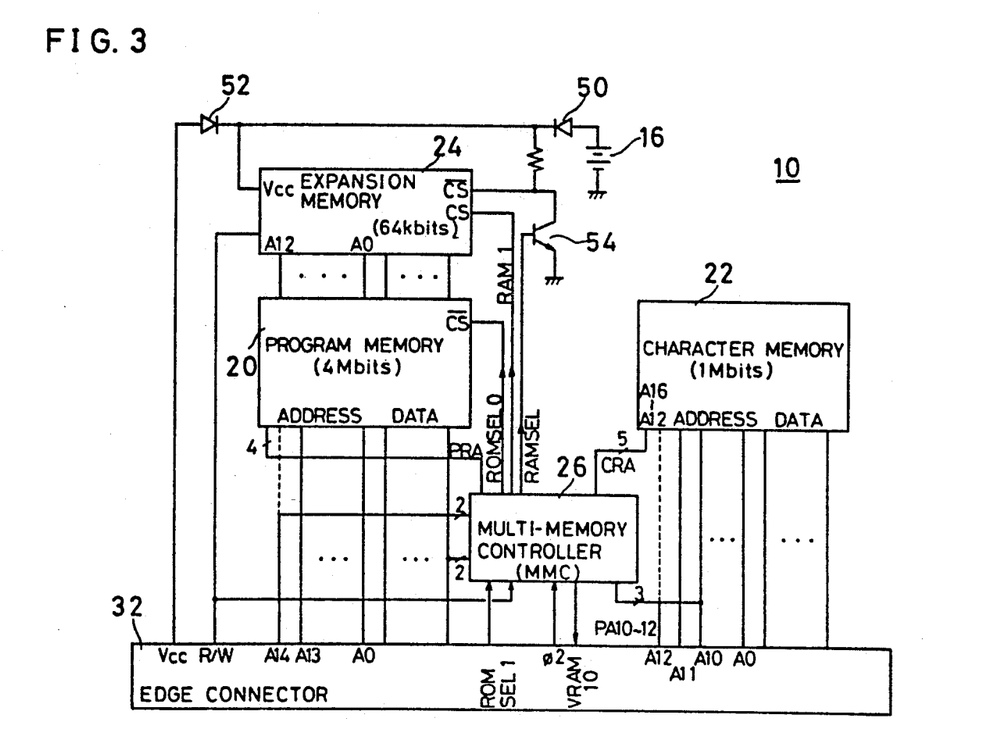
FIG. 3 is a block diagram showing a configuration of FIG. 1 embodiment.

In reference to FIG. 3, detailed description is made of a configuration of the memory cartridge 10 as illustrated in FIG. 1, which is loaded in the edge connector 32 of the main unit 30 as shown in FIG. 2. As described above, the memory cartridge 10 is connected to the edge connector 32 and is provided with data or signals from the CPU 34 and the PPU 42 of the game machine main unit 30 through the edge connector 32.

The program memory 20 receives program addresses A0–A13 from the CPU 34 (FIG. 2) and receives eight-bit data through the edge connector 32. A program address A14 from the CPU 34 is sent to the MMC 26 along with the program address A13. The character memory 22 provided with character addresses A0–A11 from the PPU 42, and character address A12 is provided to the MMC 26 along with the character addresses A10 and A11. Then, eight-bit data is sent to the character memory 22 from the PPU 42. The program addresses A0–A12 and eight-bit data are also provided to the expansion memory 24 likewise as well as the program memory 20.

To the MMC 26, a system clock φ2 is provided from the CPU 34 and also a signal ROMSEL1 specifying addresses 8000H-FFFFH of the program memory 20 also provided. Also, a read/write signal R/W is sent to the MMC 26 from the CPU 34. The read/write signal R/W is also sent to the above-described expansion memory 24.

As described in detail later, a signal RAMSEL for enabling the expansion memory 24 is sent to the expansion memory 24 from the MMC 26. In the case where the expansion memory 24 is a 64K-bit RAM located on two chips, a chip select signal RAM1 is also sent to the expansion memory 24 from the MMC 26. Furthermore, the MMC 26 outputs a signal ROMSEL0 for enabling the program memory 20. Also, the MMC 26 acts as a controlling means for bank switching of the program memory 20 and the character memory 22. Therefore, from the MMC 26 four-bit program addresses PRA14–PRA17 are sent to the program memory 20 and five-bit character addresses CRA12–CRA16 are sent to the character memory 22.

The negative electrode of the power supply 16 included in the memory cartridge 10 is grounded, and the positive electrode is connected to a power terminal Vcc of the edge connector 32 through a forward-direction diode 50 and a reverse-direction diode 52 connected to the diode 50. A power supply from the game machine main unit 30 is applied to this power terminal Vcc. The output of the diode 50 is connected to a chip select terminal CS of the expansion memory 24 through a resistor that is also connected to the collector of a transistor 54 base. The emitter of the transistor 54 is grounded, and the above-described signal RAMSEL from the MMC 26 is sent to the transistor 54. The output of the other diode 52 is connected to the power supply Vcc of the expansion memory 24.

In the case where the memory cartridge 10 is loaded in the game machine main unit 30 through the edge connector 32, the voltage Vcc is supplied to the expansion memory 24 through the diode 52. When the memory cartridge 10 is removed from the edge connector 32, or even if loaded, when a power switch 48 of the game machine main unit 30 is turned off, the voltage Vcc is sent from the power supply 16 to the expansion memory 24 through the diode 50. Thus, the diode 50 acts as both a switch applying a voltage to the expansion memory 24 and as a reverse flow blocking diode preventing the current from the game machine main unit 30 from flowing into the power supply 16.

Figure 4:
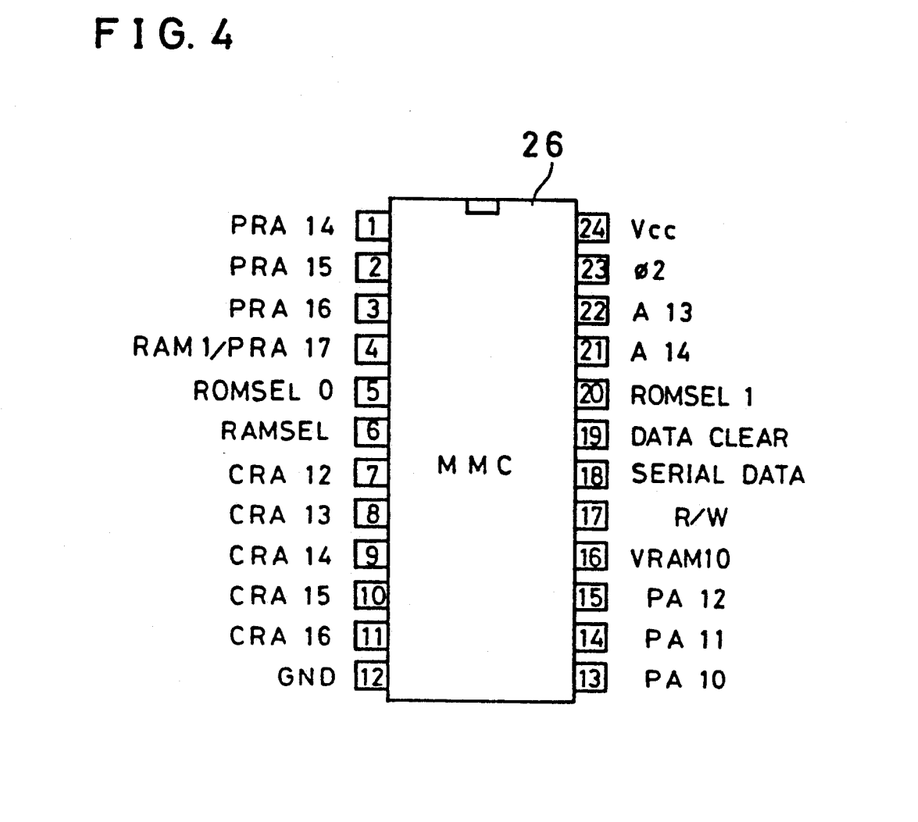
FIG. 4 is a plan view of an MMC.
Figure 5:
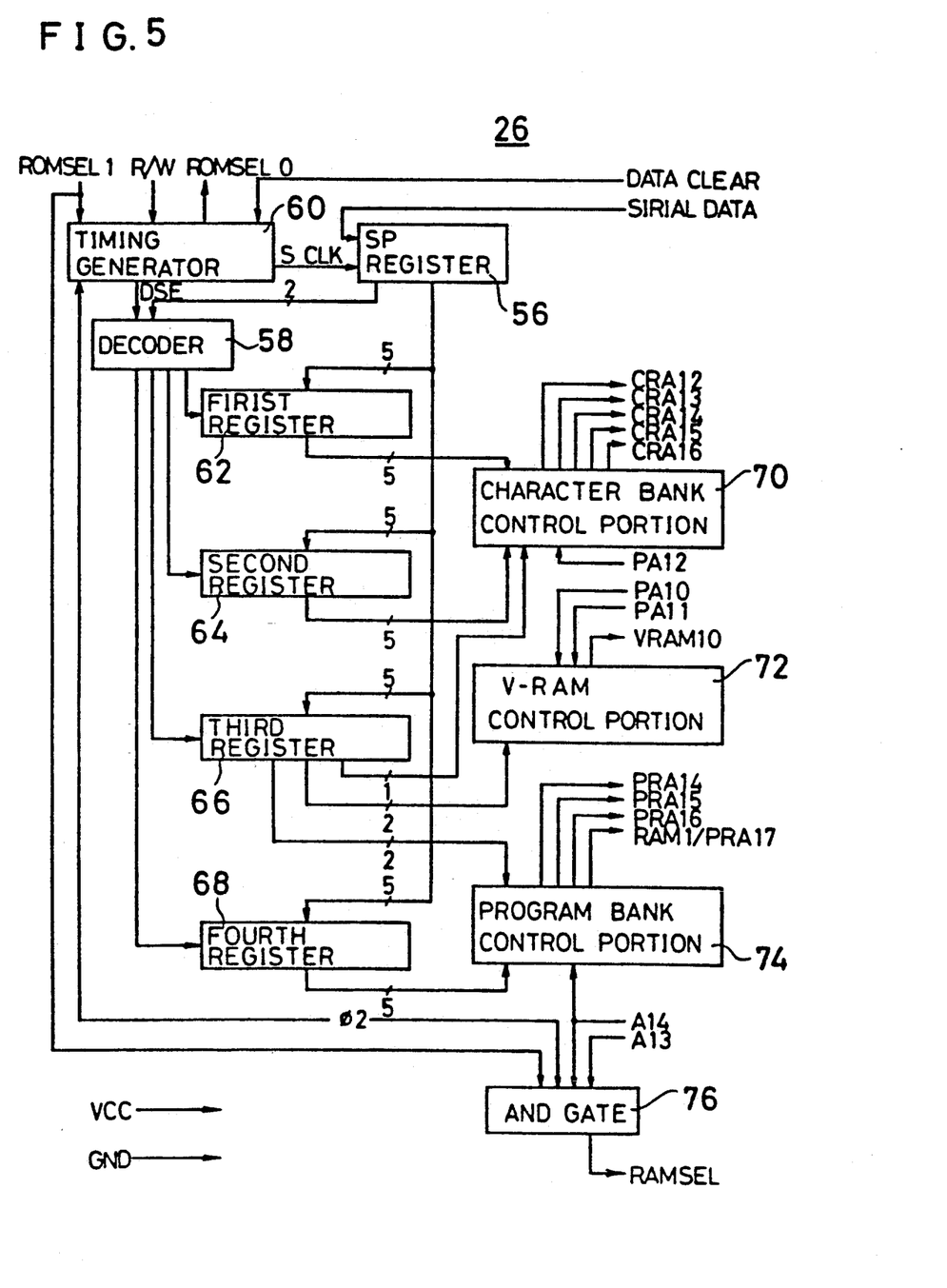
FIG. 5 is a block diagram showing the structural components of the MMC as shown in FIG. 4.
Figure 6:
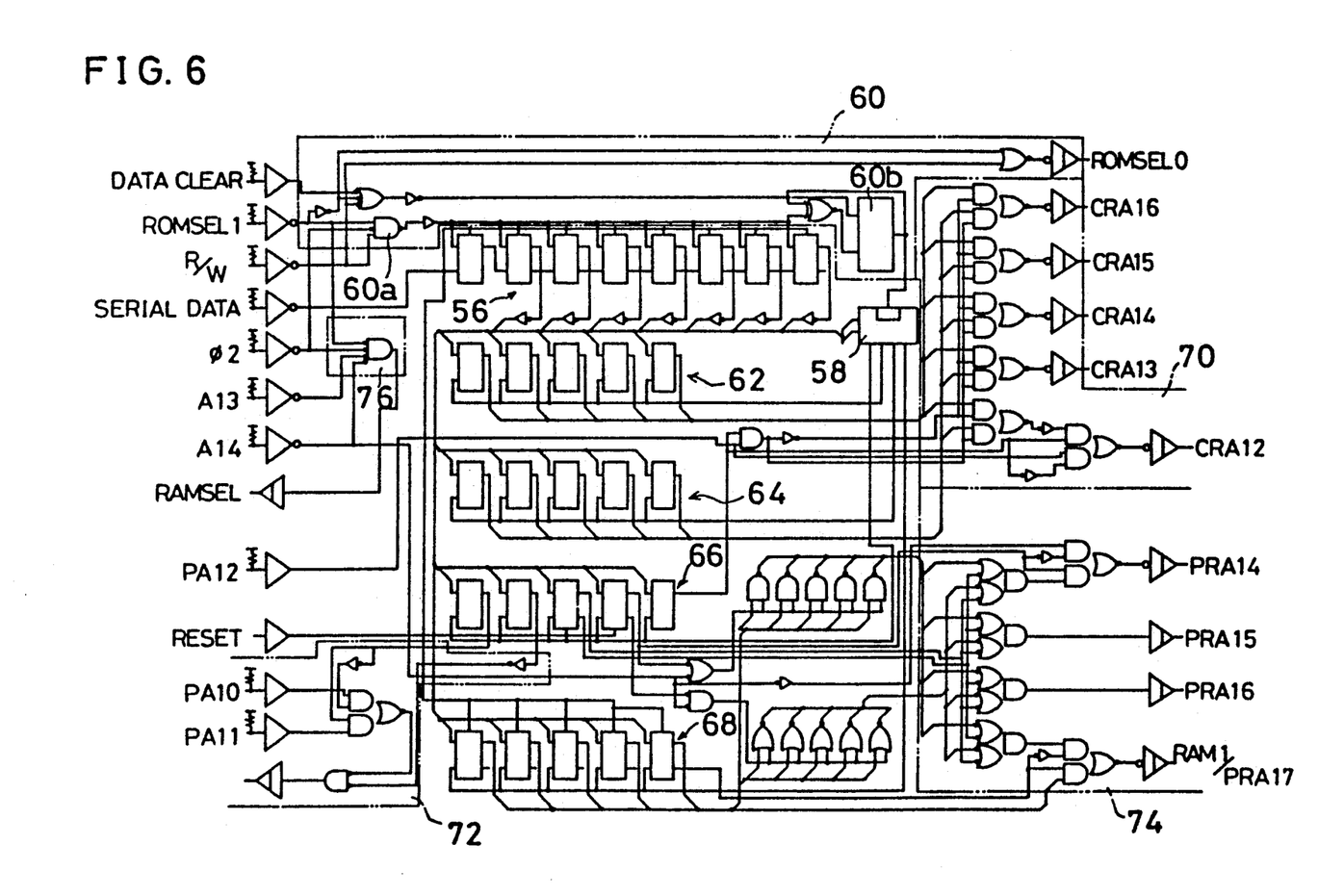
FIG. 6 is a circuit diagram of the MMC in accordance with the block diagram as shown in FIG. 5.

In reference to FIG. 4 through FIG. 6, further detailed description is made on the MMC 26 included in the memory cartridge 10. As shown in FIG. 4, the MMC 26 is one custom IC. Terminals No. 1-No. 11 and No. 16 are used as output terminals, and terminals No. 13-No. 15 and No. 17-No. 23 are used as input terminals. Terminal No. 12 is connected to a ground potential GND and a terminal 24 is connected to voltage Vcc.

To be detailed, the terminals No. 1-No. 4 are utilized as output terminals of the four-bit program addresses PRA14-PRA17, and terminal No. 4 is sometimes utilized as an output terminal of the chip select signal RAM1 of the expansion memory 24. In the case where a one-chip memory is used as the expansion memory 24 (FIG. 3), the signal RAM1 has no meaning, but acts as a one-bit chip select signal when two memory chips are mounted, it selects either of the chips by "1" or "0".

Terminal No. 5 is an output terminal for the signal ROMSEL0 sent to the above-described program memory 20, and only when the program memory 20 is read, that is, only when the read/write signal R/W from the CPU 34 is high, it is outputted as a low-level signal.

Terminal No. 6 is an output terminal for the signal RAMSEL sent to the above-described transistor 54, which specifies addresses 6000H-7FFFH of the expansion memory 24.

Terminals No. 7-No. 11 are output terminals of addresses for bank switching of the character memory 22, that is, the character addresses CRA12-CRA16.

Terminals No. 13-No. 15 are input terminals of addresses PA10-PA12 from the PPU 42.

Terminal No. 16 is an output terminal of signal VRAM10 sent to the tenth address bit of the address of the V-RAM 44. Signal VRAM 10 is utilized for specifying the memory area accessible by the PPU 42 in the V-RAM 44 and controlling make or break of scrolling.

The read/write signal R/W from the CPU 34 is sent to terminal No. 17, one-bit serial data is sent to terminal No. 18 from the CPU 34, and one-bit data clear signal, that is, a synchronizing timing signal of the above-described serial data, is sent to terminal No. 19.

The signal ROMSEL1 which specifies addresses 8000-FFFFH for the program memory 20 is sent to terminal No. 20 from the CPU 34.

Then, the program addresses A13 and A14 from the CPU 34 are sent to the terminals No. 21 and No. 22. The system clock $\phi 2$ is sent to the terminal No. 23.

As shown in FIG. 5, installed in the MMC 26 is an SP register 56 that receives serial data from the CPU 34 which is sent to the above-described terminal No. 18. As shown in FIG. 6, the SP register 56 is a seven-bit shift register, and the most significant two bits thereof are coupled to a decoder 58. Also, the MMC 26 includes a timing generator 60 which receives the signals ROMSEL1, R/W, the data clear signal and the system clock $\phi 2$. Based on the signal ROMSEL1 and the signal R/W, the timing generator 60 outputs the low-level signal ROMSEL0 when the former is low and the latter is high, and also sends a shift clock SCLK to the SP register 56 from an AND gate 60a (FIG. 6) in response to the system clock $\phi 2$. The shift clock is counted by a counter 60b (FIG. 6) included in the timing generator 60. The timing generator 60 sends a data set enabling signal DSE to the decoder 58 at the seventh clock signal after the data clear signal has been given, that is, at the point when all the seven-bit serial data from the CPU 34 is loaded in the SP register 56.

The decoder 58 receives the most significant two bits of the data from the SP register 56, decodes this data and sends a data set signal to any one of a first register 62, a second register 64, a third register 66 and a fourth register 68. Accordingly, the above-described SP register 56 and decoder 56 constitute a data multiplexer.

These registers 62-68 are all five-bit registers, and when given the data set signal by the decoder 58 they load the remaining five-bit data of the SP register 56. The contents of these registers 62-68 are used as memory control data for the program memory 20, the character memory 22 or the V-RAM 44 as, for example, a bank specifying code.

A character bank control portion 70 receives five-bit data from the first register 62 and the second register 64, also receiving the least significant one bit from the third register 66. The address PA12 from the PPU 42 (FIG. 2), which is also sent through the edge connector 32 (FIG. 3), is also sent to the character bank control portion 70. The character bank control portion 70 includes a large number of gates, as shown in FIG. 6, and output the character addresses CRA12-CRA16 for bank switching of the character memory 22 by the processing by the gates.

A V-RAM control portion 72 receives two-bit data from the third register 66, receives the addresses PA10 and PA11 from the PPU 42, and outputs the address signal VRAM10 of the V-RAM 44 according to the gate processing of a large number of gates, as shown in FIG. 6.

A program bank control portion 74 receives the most significant two bits of the third register 66 and five-bit data of the fourth register 68, receives the program address A14 which is sent from the CPU 34, and outputs the program addresses PRA14-PRA17 for bank switching of the program memory 20 according to the gate processing of a large number of gates, as shown in FIG. 6.

Furthermore, a decoder 76 is, if necessary, installed in the MMC 26. The program addresses A13 and A14 from the CPU 34, the system clock φ2, and the signal RAMSEL1 are sent to the MMC 26. As shown in FIG. 6, the decoder 76, composed of a four-input AND gate, outputs the signal RAMSEL for activating the expansion memory 24 in response to a formation of predetermined conditions.

Figure 7A:
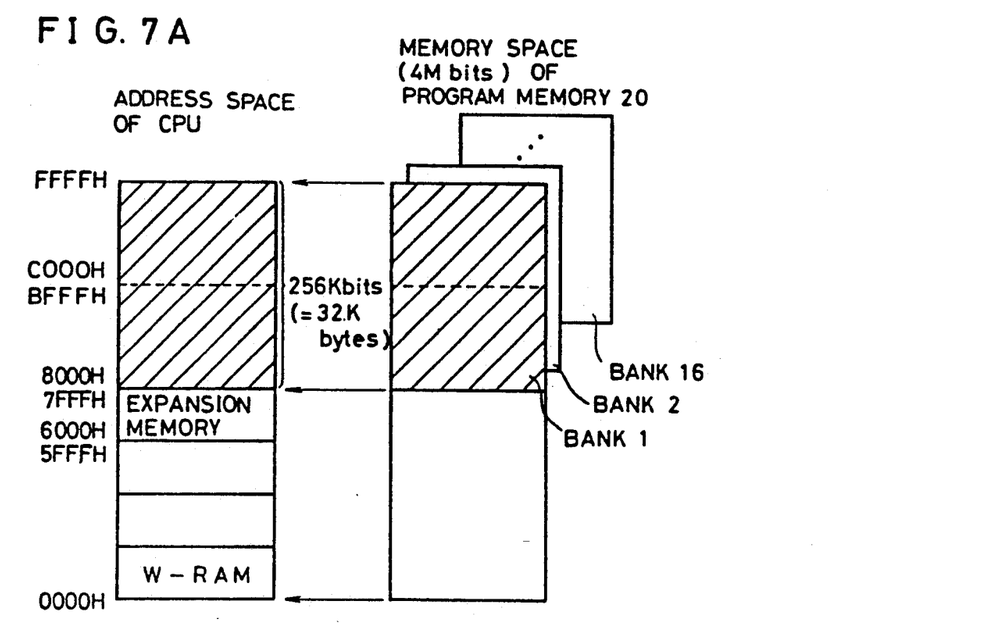
FIGS. 7A and 7B are illustrative views showing an address space of a CPU.

As described above, the CPU 34 is an eight-bit microcomputer, and the address space accessible by the CPU 34 is the addresses 0000H-FFFFH represented by $2^{16}$, as shown in FIG. 7A. Among them, the addresses 0000H-6000H are utilized as the W-RAM 36, as shown in FIG. 2, or another register area. Also, the addresses 6000H-7FFFH among addresses 6000H-8000H are utilized as address space for access to the expansion memory 24 (FIG. 3), and the addresses 8000H-FFFFH are utilized as address space for access to one bank (256K bits=32K bytes) of the program memory 20. Accordingly, in the case where the program memory 20 has a memory capacity of 4M bits (512K Byte), there are sixteen (16) banks of memory area which are addressed as address 8000H-FFFFH. These banks are switched by the MMC 26 as described later.

Figure 8:
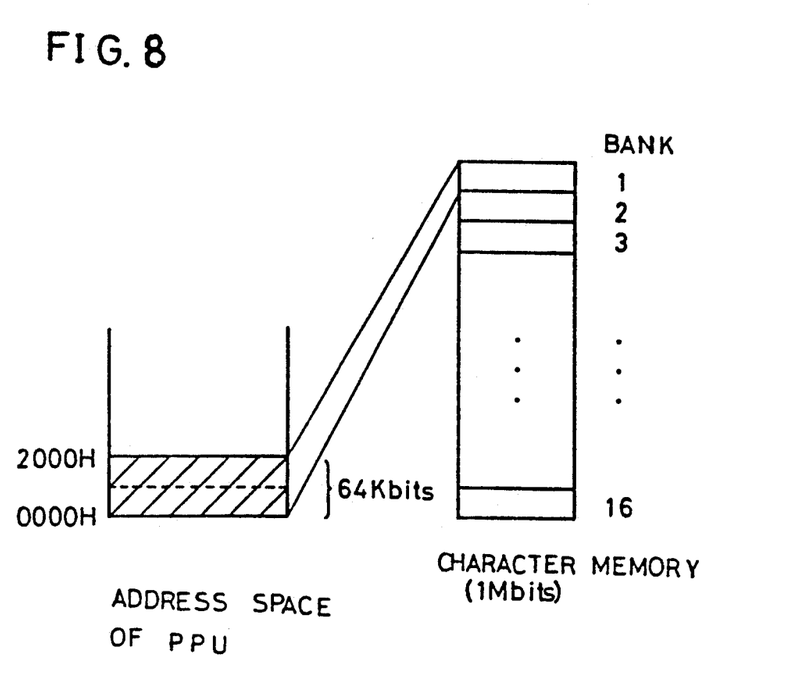
FIG. 8 is an illustrative view showing an address space of a PPU.

Also, in the PPU 42, as shown in FIG. 8, addresses 0000H-2000H are utilized as addresses for access to one bank (64K bits) of the character memory 22.

This means that in this embodiment, the program memory 20 of 4M bits is divided into 16 banks of 256K bits each, and these 16 banks are switched by the program bank control portion 74 (FIG. 5). Likewise, the character memory 22 of 1M bits is divided into 16 banks of 64K bits each, and these 16 banks are switched by the character bank control portion 70.

Figure 9:
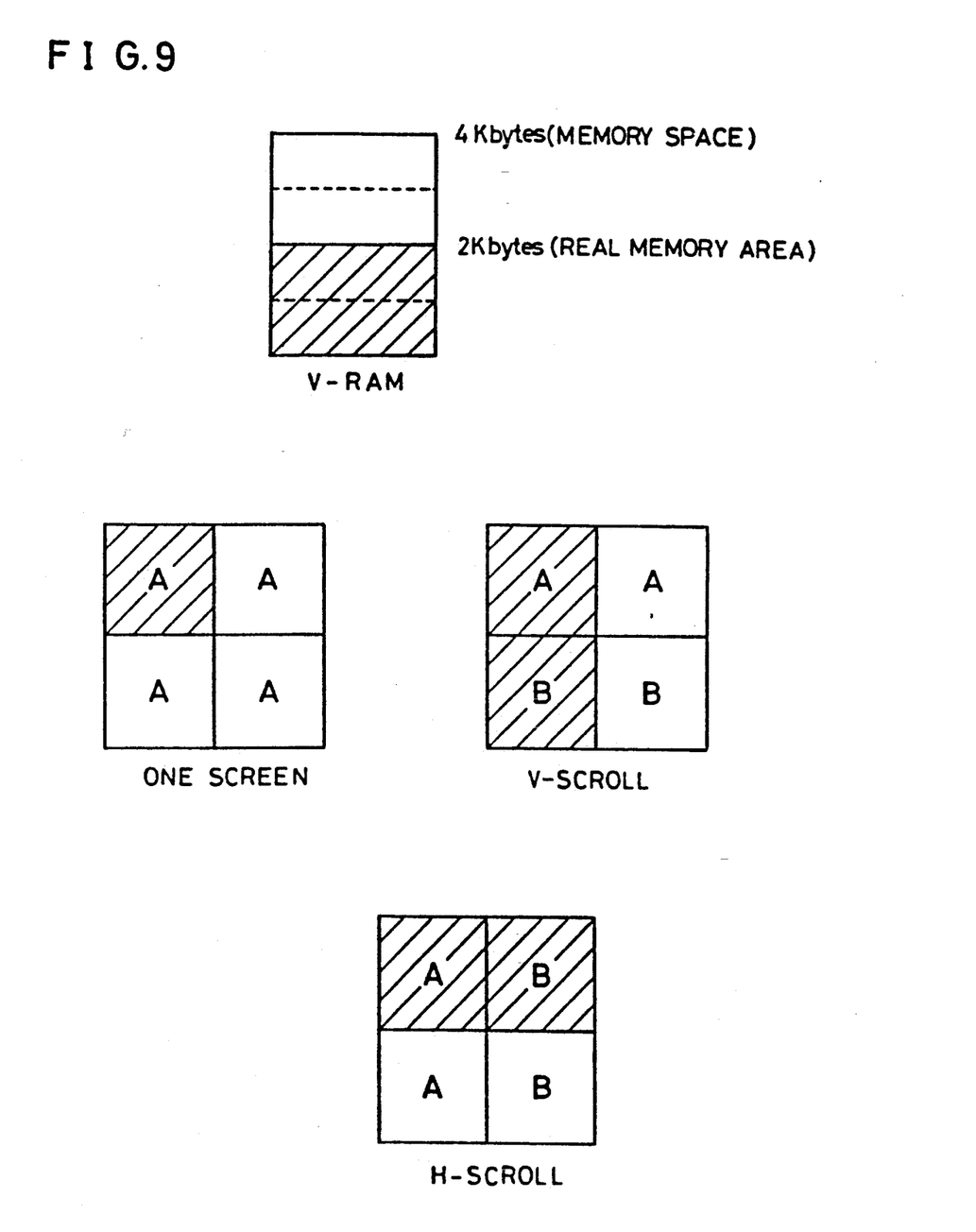
FIG. 9 is an illustrative view showing a memory map of a V-RAM.

Also, the V-RAM 44 (FIG. 4) accessed by the PPU 42 has a memory area of 4K bytes as shown in FIG. 9. However, in practice, only 2K bytes are employed as the V-RAM 44. Accordingly, when scrolling occurs on a CRT as an image displaying means (not illustrated), the addresses of the V-RAM 44 accessible by these 2K bytes must be switched. This change-over of addresses is performed by the V-RAM control portion 72. This means that, as shown in FIG. 6, the V-RAM control portion 72 includes two AND gates 72a and 72b which receive the addresses PA10 and PA11 from the PPU 42, respectively. These AND gates 72a and 72b select which one of the PA10 and the PA11 is to be sent as the signal VRAM10 which is the tenth address bit of the V-RAM 44. By this selection, the manner in which the memory space of 2K bytes of the V-RAM 44 is to be accessed, that is, the manner in which the memory area should be arranged in the address space, is determined. The result is either V scrolling (when the PA10 is sent to the VRAM10), H scrolling (when the PA11 is sent to the VRAM10) or a state where no scrolling is performed.

Then, when an AND gate 72c of the V-RAM control portion 74 is disabled by another bit output of the third register 66, the address PA10 or PA11 of the PPU 42 is not output as the signal VRAM10, and this signal VRAM10, the tenth address bit of the V-RAM 44, is then low at all times. Consequently, a memory area of the V-RAM 44 for only one screen, that is, 1K bytes, is made accessible by the PPU 42 independent of the address from the PPU 42.

Next, description is provided of the bank switching of the program memory 20 and bank switching of the character memory 22.

To switch the banks of the program memory 20, serial data, whose most significant two bits are "11" and whose remaining five bits are a code specifying any one of 16 banks of the program memory 20, is sent to the terminal No. 18 of the MMC 26 from the CPU 34 through the edge connector 32. Then the seven-bit data is loaded in the SP register 56, and the signal DSE is outputted to the decoder 58 from the timing generator 60. The decoder 58 decodes two-bit data "11" of the SP register 56, sending the data set signal to the fourth register 68. The remaining five bits of the SP register 56 are then loaded in the fourth register 68. The bank selection code loaded in the fourth register 68 is sent to the program bank control portion 74.

The program bank control portion 74 outputs the addresses PRA14-PRA17 for bank switching of the program memory 20 when the most significant bit of five bits to be sent is "0", and outputs the signal RAM1, a chip select signal, to the expansion memory 24 from the terminal No. 4 when the most significant bit is "1". Accordingly, whether only the bank address of the program memory 20 is output from the program bank control portion 74, or a three-bit program address for bank switching and a one-bit change-over signal for the expansion memory 24 is output depends on whether "0" or "1" is the most significant one bit of the five-bit data loaded in the fourth register 68.

When, the four-bit program addresses PRA14-PRA17 are sent to the program memory 20 from the program bank control portion 74, any one of 16 banks of the program memory 20 is enabled selectively by the four-bit address. Then, only the enabled bank is accessible directly by the CPU 34. This means that by utilizing the address space of 8000H-FFFFH, the CPU 34 accesses to that bank of the program memory 20.

Thus, for the banks of the program memory 20, an arbitrary bank is selected by changing the serial data from the CPU 34. The bank switching of the program memory 20 can be executed by program, that is, by entering bank select data in advance in the program of the CPU 34. The same is true of the bank switching of the character memory 22 as described below.

Next, an explanation follows where the expansion memory 24 is selected. The expansion memory 24 is utilized when the memory capacity (2K byte) of the W-RAM 36 in the main unit 30 is not sufficient. Address 6000H-7000H which is different from the address space (8000H-FFFFH) of the program memory 20 is assigned to the address space of the expansion memory 24. The AND gate 76 outputs the signal RAMSEL in a short time period when the AND condition is detected of the addresses A13 and A14, system clock φ2, and the inversion of the signal ROMSEL1. In response to the signal RAMSEL, the transistor 54 is turned on, and the expansion memory 24 is selected. In this state, the CPU 34 sends the address data within the address space and the data to be written to the expansion memory 24 so as to write the data into the expansion memory 24, or reads the data from the expansion memory 24. When the system clock φ2 reverses, the AND gate 76 stops the output of the signal RAMSEL, and the expansion memory 24 enters into a non-selected state. This means that the expansion memory 24 is selected within a short time period of the CPU 34 machine cycle and has no relation to the switching of the bank of the program memory 20. The data is thus written or read into or from the expansion memory 24 in real time. Thus, the address bus and the data bus of the program memory 20 can be used for the expansion memory (RAM) 24 without adding any address and data lines for CPU 34.

In addition, if a backup power source 16 is provided with the expansion memory 24, advanced game states such as a score and a stage number being advanced and the like are stored in the expansion memory 24. The data representing the game state of the last game executed is maintained and the game can be continued even if the memory cartridge 10 is unloaded or the power switch is turned off.

Figure 7B:
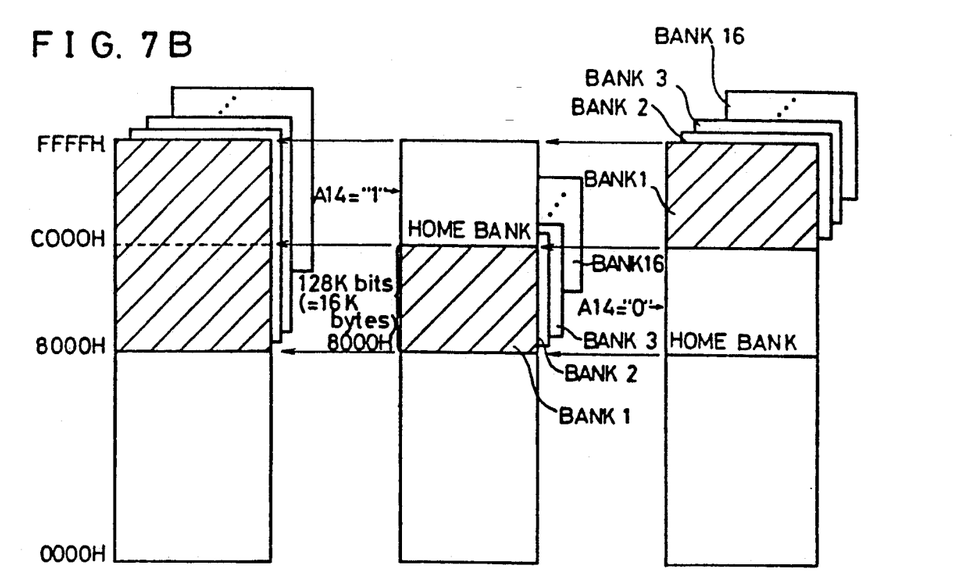

In addition, the program memory 20 may be switched as banks of 128K bits (=16 bytes) for example, each in place of the switching on a 256K bit bank basis. In such a case, the output the third register 66 designates that the program memory 20 is to be bank switched for each unit of 128K bits (=16K bytes). When the address A14 is "1", the address space COOOH-BFFFH is specified as a home bank, and the address space 8000H-BFFFH is bank switched based on the output of the fourth register 68 (see the middle of FIG. 7B). On the other hand, when the address A14 is "0", the address space 8000H-COOOH is specified as the home bank, and the address space COOOH-FFFFH is bank switched by the output of the fourth register 68 (see the right of FIG. 7B). The home bank is an area where the program of the main routine and the like is stored. A system where the banks having 256K bits are switched is used in the case where the programs are switched and executed on the bank basis. By contrast, a system where the banks having 128K bits are switched is used in the case where the game data (for example, the position of the character, data for specifying a kind of character) stored in such a bank is switched and utilized while the program of the home bank is executed. That is, the latter system is advantageous for executing an interrupt routine while the program of the home bank is executed, or for generating sound effects.

Next, character memory 22 bank switching is described. The bank switching of the character memory 22 can be performed two ways; the switching on a 64K bit bank basis or the bank switching on a 32K bit bank basis. This means that the character memory 22 may be switched as 16 banks or as 32 banks. Such a switching of the bank size is performed by the least significant one bit of the third register 66, and the switching is made on a 64K bit bank basis when the least significant bit is "0", and on a 32K bit bank basis when the bit is "1".

Then, when the least significant bit of the third register 66 is "1", the character bank control portion 70 selects one of 32 banks of the character memory 22 based on the bank specifying code of a total of 10 bits from the first register 62 and the second register 64. Also, when the least significant bit of the third register 66 is "0" the character bank control portion 70 selectively enables any one of 16 banks according to the content of the most significant four bits of the second register 64.

Where the character memory 22 is switched on a 32K bit bank basis, the PPU 42 uses the address space 0000F-0FFFH or 1000H-1FFFH. In the case where the switching is performed on a 64K bit bank basis, the PPU 42 uses the address space 0000H -1FFFFH.

In addition, in the above-described embodiment, the program memory 20 and the character memory 22 may be constituted with separate memory chips, respectively. However, by constituting them both with the same ROM or RAM, they both may use different memory areas in the same memory chip.

Furthermore, in the above-described embodiment, a one-chip memory having a large memory capacity is used as the program memory 20. However, a plurality of memory chips may be used if it is difficult to use such a large sized memory chip.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory cartridge which can be connected to a data processing unit that includes a microprocessor and a picture processing unit coupled to said microprocessor, said memory cartridge being coupled to said data processing unit when in use, said memory cartridge comprising:

a program memory for storing a plurality of instructions including a memory area divided into a plurality of memory banks, said program memory being coupled to said microprocessor when said memory cartridge is loaded in said data processing unit, a character memory for storing pattern data and including a memory area divided into a plurality of memory banks, said character memory being coupled to said picture processing unit when said memory cartridge is loaded in said data processing unit, and a memory control circuit, coupled to said microprocessor and said picture processing unit when said memory cartridge is loaded in said data processing unit, including a first storage device for storing at least one bit of program memory bank specifying data, and a second storage device for storing at least one bit of character memory bank specifying data, said memory control circuit including at least one output pin which is coupled to said program memory for coupling a program memory bank specifying code from said first storage device to said program memory, and at least one output pin which is coupled to said character memory for coupling a character memory bank specifying code from said second storage device to said character memory, wherein said data processing unit is coupled in use to a display and wherein said memory control circuit is responsive to at least a predetermined signal received from said data processing unit for initiating a predetermined display operation.

2. A memory cartridge according to claim 1, wherein said predetermined display operation is scrolling.

3. A memory cartridge according to claim 2, wherein said data processing unit includes a video random access memory having a memory area accessible by said picture processing unit and wherein said memory area is arranged in the memory space of the picture processing unit in a manner which is dependent upon said at least a predetermined signal, whereby one of a vertical scrolling operation and a horizontal scrolling operation occurs on said display.

4. A memory cartridge according to claim 1, wherein said predetermined signal is an address related signal.

5. A memory cartridge according to claim 4, wherein said data processing unit includes a video random access memory (VRAM) and wherein said address related signal defines a VRAM memory arrangement permitting one of a horizontal scrolling operation and a vertical scrolling operation to occur on said display.

6. A memory cartridge which can be connected to a data processing unit that includes a microprocessor and a picture processing unit coupled to said microprocessor, said memory cartridge being coupled to said data processing unit when in use, said memory cartridge comprising:
- a program memory for storing a plurality of instructions including a memory area divided into a plurality of memory banks, said program memory being coupled to said microprocessor when said memory cartridge is loaded in said data processing unit,
- a character memory for storing pattern data and including a memory area divided into a plurality of memory banks, said character memory being coupled to said picture processing unit when said memory cartridge is loaded in said data processing unit, and
- a memory control circuit, coupled to said microprocessor and said picture processing unit when said memory cartridge is loaded in said data processing unit, including a first storage device for storing at least one bit of program memory bank specifying data, and a second storage device for storing at least one bit of character memory bank specifying data,
- said memory control circuit including at least one output pin which is coupled to said program memory for coupling a program memory bank specifying code from said first storage device to said program memory, and at least one output pin which is coupled to said character memory for coupling a character memory bank specifying code from said second storage device to said character memory, wherein said memory control circuit is loaded with bank specifying data in response to at least one microprocessor generated control signal which controls at least in part selection and accessing of a predetermined memory chip within said memory cartridge, wherein said at least one microprocessor generated control signal is a read/write signal.

7. A memory cartridge according to claim 6, wherein said at least one microprocessor generated control signal includes a read-only memory selection signal.

8. A memory cartridge which can be connected is removably connectable to a data processing unit that includes a microprocessor and a picture processing unit coupled to said microprocessor, said memory cartridge being coupled to said data processing unit when in use, said memory cartridge comprising:
- a program memory for storing a plurality of instructions including a memory area divided into a plurality of memory banks, said program memory being coupled to said microprocessor when said memory cartridge is loaded in said data processing unit,
- a character memory for storing pattern data and including a memory area divided into a plurality of memory banks, said character memory being coupled to said picture processing unit when said memory cartridge is loaded in said data processing unit, and
- a memory control circuit, coupled to said microprocessor and said picture processing unit when said memory cartridge is loaded in said data processing unit, including a first storage device for storing at least one bit of program memory bank specifying data, and a second storage device for storing at least one bit of character memory bank specifying data,
- said memory control circuit including at least one output pin which is coupled to said program memory for coupling a program memory bank specifying code from said first storage device to said program memory, and at least one output pin which is coupled to said character memory for coupling a character memory bank specifying code from said second storage device to said character memory, wherein said memory control circuit is loaded with bank specifying data in response to at least one microprocessor generated control signal which controls at least in part selection and accessing of a predetermined memory chip within said memory cartridge, wherein said at least one microprocessor generated control signal is a read-only memory selection signal.

9. A memory cartridge which can be connected is removably to a data processing unit that includes a microprocessor and a picture processing unit coupled to said microprocessor, said memory cartridge being coupled to said data processing unit when in use, said memory cartridge comprising:
- a program memory for storing a plurality of instructions including a memory area divided into a plurality of memory banks, said program memory being coupled to said microprocessor when said memory cartridge is loaded in said data processing unit,
- a character memory for storing pattern data and including a memory area divided into a plurality of memory banks, said character memory being coupled to said picture processing unit when said memory cartridge is loaded in said data processing unit, and
- a memory control circuit, coupled to said microprocessor and said picture processing unit when said memory cartridge is loaded in said data processing unit, including a first storage device for storing at least one bit of program memory bank specifying data, and a second storage device for storing at least one bit of character memory bank specifying data,
- said memory control circuit including at least one output pin which is coupled to said program memory for coupling a program memory bank specifying code from said first storage device to said program memory, and at least one output pin which is coupled to said character memory for coupling a character memory bank specifying code from said second storage device to said character memory, wherein said first storage device is a first register for storing at least one bit of program memory bank specifying code, and said second storage device is a second register for storing at least one bit of character memory bank specifying code.

10. External memory apparatus which can be connected to a video game apparatus having a microprocessor, a picture processing unit coupled to said microprocessor, and a connector, said microprocessor being connected to at least one CPU bus and said picture processing unit being connected to at least one PPU bus, said at least one CPU bus and said at least one PPU bus being connected to said connector, said external memory apparatus comprising:
- an array of connecting electrodes connected to said connector when said external memory apparatus is loaded into said video game apparatus, said array of connecting electrodes including a first plurality of electrodes disposed to receive in use signals from said at least one CPU bus, a second plurality of electrodes being disposed to receive in use signals from said at least one PPU bus, and a third plurality of electrodes disposed to receive in use memory accessing related signals generated by said microprocessor;

a program read-only memory, coupled to receive signals from said first plurality of electrodes;

a character memory, coupled to receive signals from said second plurality of electrodes each of said program read-only memory and said character memory having a plurality of memory banks, a memory control circuit connected to said program read-only memory and said character memory, and at least to said third plurality of electrodes, said memory control circuit including at least one storage device and being responsive to a memory read/write signal and a memory selection signal received from said microprocessor for writing bank selecting data into said at least one storage device for selecting at least one of said plurality of memory banks of said program read-only memory and/or said character memory.

11. External memory apparatus according to claim 10, wherein said at least one storage device includes a first register for storing program read-only memory bank specifying data and a second register for storing character memory bank specifying data.

12. A memory cartridge which can be connected to a data processing unit that includes a microprocessor, a picture processing unit coupled to said microprocessor, a video memory having a memory area which is accessible by said picture processing unit, and a video monitor for displaying an image based on data from said picture processing unit, said memory cartridge being coupled to said data processing unit when in use, said memory cartridge comprising:

a program memory for storing a plurality of instructions, said program memory being coupled to said microprocessor when said memory cartridge is loaded in said data processing unit, a character memory for storing pattern data, said character memory being coupled to said picture processing unit when said memory cartridge is loaded in said data processing unit, at least one of said program memory and said character memory including a memory area divided into a plurality of memory banks, and a memory control circuit, coupled to said microprocessor and said picture processing unit when said memory cartridge is loaded in said data processing unit, including register means for storing memory bank specifying data, said memory control circuit including at least one output pin which is coupled to at least one of said program memory and said character memory for coupling a memory bank specifying code to at least one of said program memory and said character memory;

said memory control circuit including a video memory control circuit, responsive to memory bank specifying signals received from said data processing unit for selecting the manner in which the memory area of the video memory is arranged in the address space of the picture processing unit, whereby one of a vertical scrolling operation and a horizontal scrolling operation may be performed on said video monitor; wherein data stored in the memory area of the video memory corresponds to a plurality of display screens of said video monitor and may be aligned to facilitate one of vertical scrolling and horizontal scrolling, wherein said memory bank specifying signals are used by said video memory control circuit to select one of a vertical scrolling alignment and a horizontal scrolling alignment.

* * * * *